(12) United States Patent
Ambilkar et al.

(10) Patent No.: US 7,904,289 B2
(45) Date of Patent: Mar. 8, 2011

(54) METHOD AND SYSTEM FOR TESTING FUNCTIONALITY OF A CHIP CHECKER

(75) Inventors: Shridhar Narasimha Ambilkar, Bangalore (IN); Girish Gopala Kurup, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 613 days.

(21) Appl. No.: 11/938,532

(22) Filed: Nov. 12, 2007

(65) Prior Publication Data

US 2009/0125292 A1     May 14, 2009

(51) Int. Cl.
*G06F 9/455* (2006.01)
(52) U.S. Cl. .................. 703/27; 716/4; 716/5
(58) Field of Classification Search .......... 703/27; 716/4, 5; 714/724, 726, 728, 735, 736, 741
See application file for complete search history.

(56) References Cited

U.S. PATENT DOCUMENTS

| | | | |
|---|---|---|---|
| 5,621,312 A * | 4/1997 | Achor et al. | 324/158.1 |
| 6,834,359 B2 | 12/2004 | Boehm et al. | |
| 6,993,736 B2 | 1/2006 | Syed et al. | |
| 7,047,174 B2 | 5/2006 | Koh et al. | |
| 7,055,113 B2 | 5/2006 | Broberg, III et al. | |
| 7,132,845 B1 | 11/2006 | Lamson et al. | |
| 2002/0143510 A1 * | 10/2002 | Peters et al. | 703/14 |
| 2003/0115564 A1 * | 6/2003 | Chang et al. | 716/8 |
| 2005/0229121 A1 | 10/2005 | Hildebrant | |

* cited by examiner

*Primary Examiner* — Dwin M Craig
(74) *Attorney, Agent, or Firm* — Sprusons and Ferguson; Roy W. Truelson

(57) ABSTRACT

A method for testing functionality of a chip checker is disclosed. The checker is arranged for generating a predetermined verification signal when the chip, upon receiving a predetermined input signal, generates a corresponding response signal. The method comprises the steps of developing a model of the chip, the model at least partially emulating at least one response of the chip by generating, upon receiving the predetermined input signal, the corresponding response signal. The method further supplies the developed chip model with the predetermined input signal. The checker is then used to test whether the generated response signal corresponds to the respective predetermined input signal. A failure of the checker to generate the predetermined verification signal indicates checker malfunction.

11 Claims, 4 Drawing Sheets

METHOD AND SYSTEM FOR TESTING FUNCTIONALITY OF A CHIP CHECKER

TECHNICAL FIELD

The present invention relates to a method and a system for testing microchip checkers, and in particular for testing microchip checkers outside of a full microchip environment.

BACKGROUND OF THE INVENTION

A checker is a software module developed for the purpose of verifying the various functionalities of a chip. A checker operates by testing whether, upon providing a predetermined input signal to the chip, the required outputs from the various hierarchical levels of the chip are obtained. However, since the coverage data to be captured by the checker is often temporal by nature, the checkers are usually complex and the building process of the checker itself requires multiple iterations. In addition, because of its functionality, the validation of a checker generally requires a full chip environment. Accordingly, compiling and running a checker is necessarily associated with compiling and running the complete chip model. Thus, developing a correctly functioning checker is difficult and time consuming.

FIG. 1 shows the conventional arrangement of testing a checker 1. After the combined model 2 of the checker 1 and the chip 3 is built, a test case 4 is run to facilitate the test of the validity of the checker 1. The checker 1 will provide a temporal coverage data 5 only if predetermined checker input conditions have been met. The driving signals $7^I$ are chosen so that checker input signals 6 are obtained from different hierarchical modules within the chip model 3, as indicated by the arrows in FIG. 1. When the test case 4 is run, driving signals $7^I$ and $7^{II}$ drive the chip 3 and the checker 1, respectively. Respective inputs 6 to the checker are activated when the test case 4 aids the condition in the design of the respective modules in the chip. The input signals 6 trigger the generation of coverage data 5 by the checker 1. Data 5 is generated if each input signal 6 is active at a time corresponding to the time sequence of the driving signals $7^I$ and $7^{II}$. However, if no coverage data 5 is generated, no definite conclusion can be made about the functionality of the checker. This is so because the lack of coverage data 5 can be caused by either the test case 4 not satisfying the expected condition or the checker 1 being designed incorrectly. The task of finding the exact cause for the lack of coverage data 5 is time consuming. Hence, it is desirable to develop a faster way of testing the validity of a checker.

SUMMARY OF THE INVENTION

According to one aspect of the invention, there is provided a method for testing functionality of a chip checker. The checker is arranged for generating a predetermined verification signal in response to receiving a driving signal and a corresponding response signal generated by the chip in response to the driving signal. The method comprises;
a) developing a model of the chip, the model emulating at least one response of the chip by generating, upon receiving a predetermined driving signal, the corresponding response signal,
b) supplying the developed chip model with the driving signal; and
c) supplying the checker with the driving signal and the corresponding response signal generated by the chip and
d) verifying any malfunctions with the predetermined verification signal provided to the checker.

According to a second aspect of the invention, there is provided a method for facilitating building a chip checker. The checker is arranged for generating a predetermined verification signal in response to receiving a driving signal and a corresponding response signal, generated by the chip in response to the driving signal. The method comprises;
a) developing a model of the chip, the model emulating at least one response of the chip by generating, upon receiving a predetermined driving signal, the corresponding response signal;
b) supplying the developed chip model with the driving signal;
c) supplying the checker with the driving signal and the corresponding response signal generated by the chip;
d) verifying any malfunctions with the predetermined verification signal provided to the checker, and
e) amending the checker, upon detecting a malfunctions.

Preferably, the method further comprises repeating at least steps c) to e) until the predetermined verification signal is generated by the checker.

According to a third aspect of the invention, there is provided an electronic system for testing functionality of a chip checker. The checker is arranged for generating a predetermined verification signal in response to receiving a driving signal and a corresponding response signal, generated by the chip in response to the driving signal. The system comprises;
a) computational means for developing a model of the chip, the model emulating at least one response of the chip by generating, upon receiving a predetermined driving signal, the corresponding response signal;
b) computational means for supplying the developed chip model with the driving signal; and
c) computational means for supplying the checker with the driving signal and the corresponding response signal generated by the chip;

wherein the system is arranged so that a failure of the checker to generate the predetermined verification signal indicates checker malfunction.

According to a fourth aspect of the invention, there is provided an electronic system for facilitating building a chip checker. The checker is arranged for generating a predetermined verification signal in response to receiving a driving signal and a corresponding response signal, generated by the chip in response to the driving signal. The system comprises;
a) computational means for developing a model of the chip, the model emulating at least one response of the chip by generating, upon receiving a predetermined driving signal, the corresponding response signal;
b) computational means for supplying the developed chip model with the driving signal;
c) computational means for supplying the checker with the driving signal and the corresponding response signal generated by the chip; and
d) computational means for prompting a user to introduce amendments to the checker, upon failure of the checker to generate the predetermined verification signal.

According to a fifth aspect of the invention, there is provided the method of the first aspect of the invention the method further comprising executable code arranged to run on a processing unit, the executable code being arranged to, upon execution, effect the steps in the method.

According to a sixth aspect of the invention, there is provided a computer readable medium encoded with the executable code of the method of the fifth aspect.

According to a seventh aspect of the invention, there is provided a system for testing functionality of a chip checker. The checker is arranged for generating a predetermined verification signal in response to receiving a driving signal and a corresponding response signal generated by the chip in response to the driving signal. The system comprises;
a) a model of the chip, the model emulating at least one response of the chip by generating, upon receiving a predetermined driving signal, the corresponding response signal,
b) a model of the checker, and
c) test case module for facilitating the test,
wherein the system is arranged so that driving signals are provided to the chip model and the checker model, the checker being also supplied with the response signals generated by the chip in response to the driving signals, a failure of the checker to generate the predetermined verification signal indicating checker malfunction.

DETAILED DESCRIPTION

Figure 2:
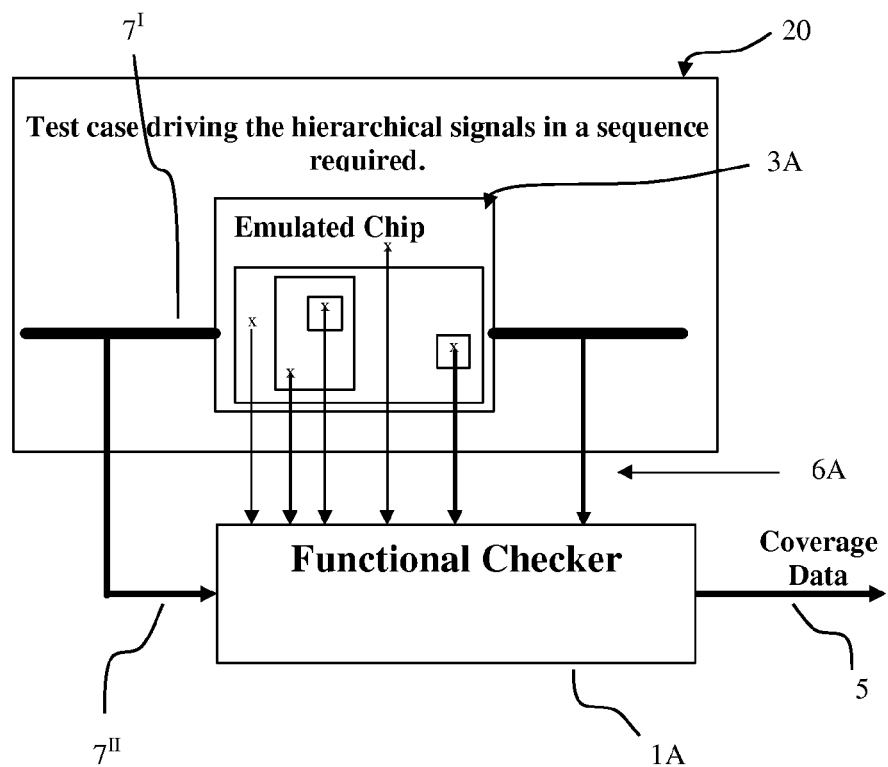
FIG. 2 is a schematic diagram of an arrangement for testing the validity of checker in a pseudo-full chip environment, embodying the invention.
Figure 3:
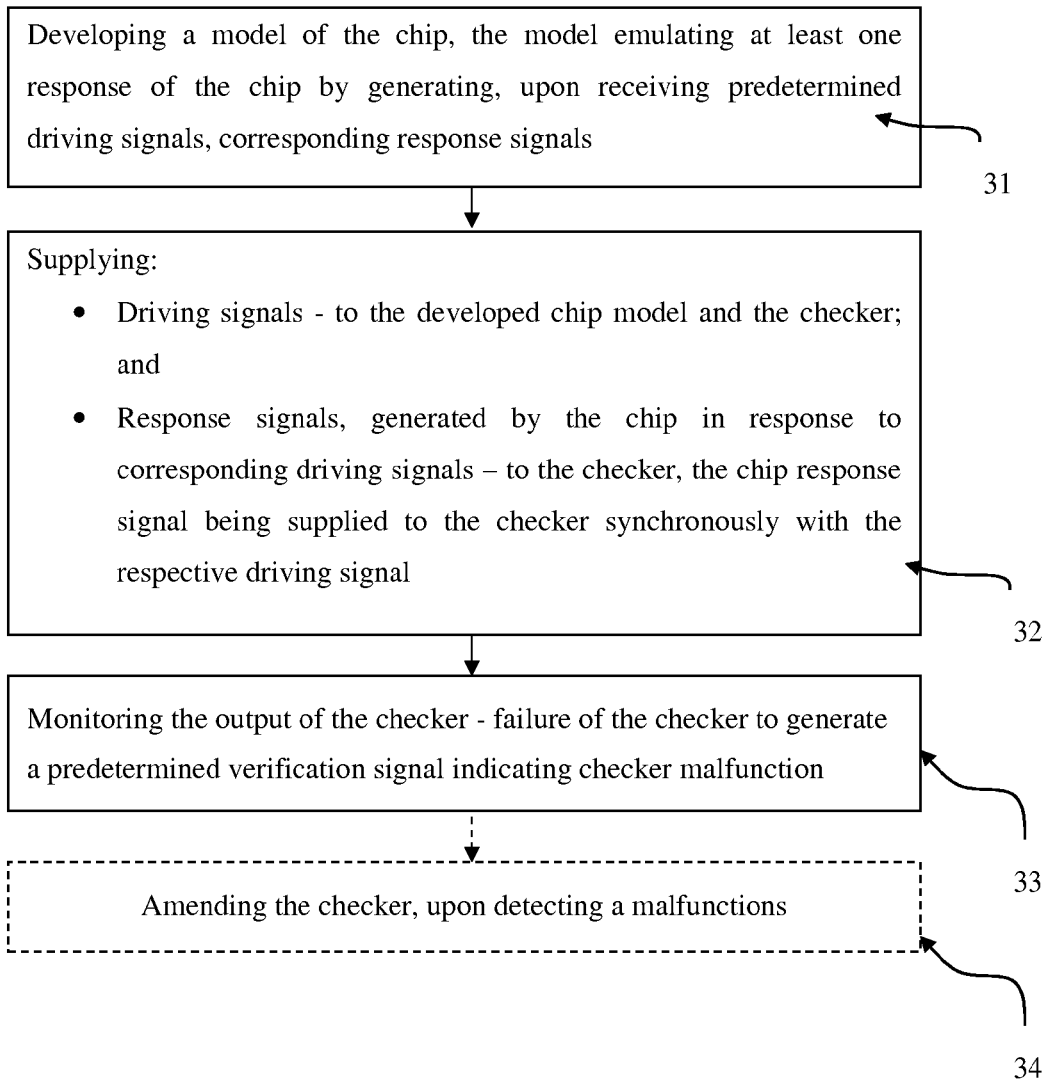
FIG. 3 is a schematic flow diagram of the method employed in the arrangement of FIG. 2.

A schematic diagram of a system 20 for testing the validity of a checker is shown in FIG. 2, while the steps of the associated method are presented in the flow diagram of FIG. 3. The described method does not require a whole chip test environment and the chip design data. A test-case, not shown in FIG. 2, is written to generate inputs $7^I$ and the $7^{II}$, driving the chip model 3A and the checker 1A, respectively. The model 3A of the chip is developed (step 31 of FIG. 3) to emulate one or more responses of the chip by generating, upon receiving the predetermined driving signals $7^I$, the corresponding response signals 6A. When, in step 32 (FIG. 3), the driving signals $7^I$ are provided to the chip model 3A, the corresponding response signals 6A are brought out of the chip boundary and supplied to the checker 1A. Notably, the response signals 6A are supplied to the checker in a synchronized manner with the driving signals $7^I$ and $7^{II}$. Thus, signals 6A are driven from the test case in a required sequence and maintain the signal and the module hierarchy.

Figure 1:
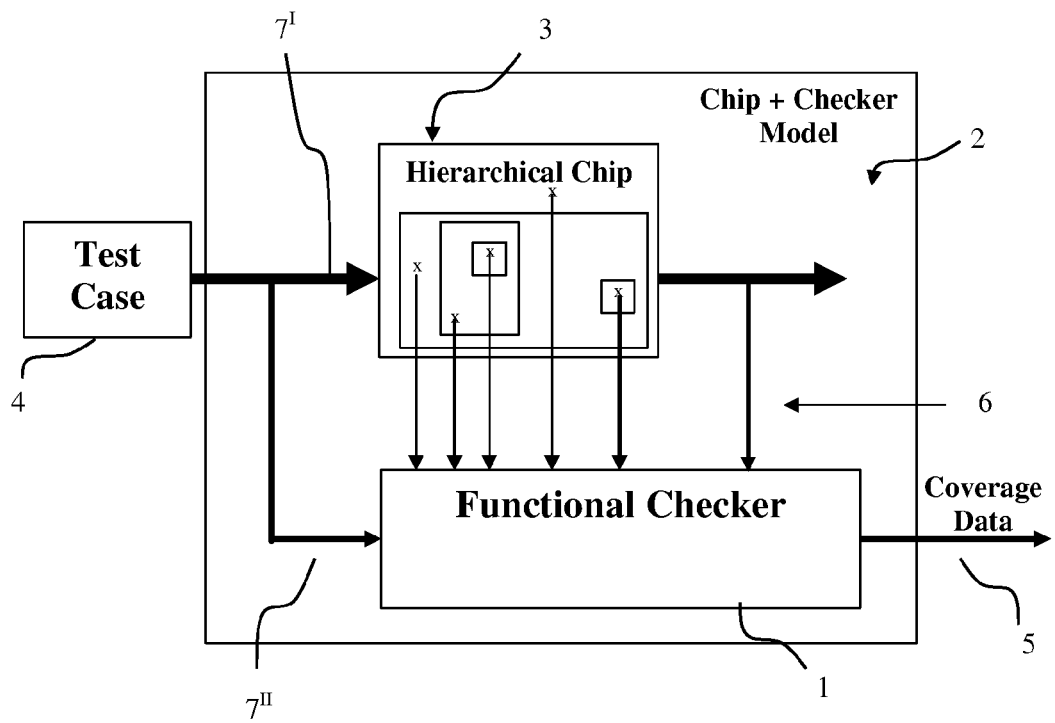
FIG. 1 is a schematic diagram of a conventional combined (chip and checker) model for testing functionality of a checker.

Upon receiving signals 6A from the chip 3A, the checker 1A generates coverage data output 5. The output data 5 is monitored (step 33 of FIG. 3) and compared with a predetermined validating pattern, indicative of a correctly functioning device. If at any point of the test routine the output coverage data 5 deviates from the expected pattern, the checker 1A is modified (step 34 of FIG. 3) and the compile-build process (steps 32 to 34) is repeated until the correct response on behalf of the checker is obtained. It is to be appreciated that, even though the build process of the checker 1A is not conducted in a full-chip environment, the emulated chip responses result in a pseudo-full chip environment, which allows testing of the entire set of checker functionality. On the other hand, since the checker model is built and compiled on its own, the compile/build times are reduced in comparison to the equivalent times associated with the prior art combined (chip+checker) system of FIG. 1.

EXAMPLE

The programming modules illustrating the above discussed method are written in a "Very High Speed Integrated Circuit Hardware Description Language (VHDL). As was explained above, the aim of the proposed method is to test the functionality of a checker employed to verify the operation of a chip. In this example, the checker test the functioning of a portion of a VHDL microchip source file. The particular portion of a VHDL microchip source file is the "SLICE0" module 41 from the chip hierarchy of FIG. 4.

The checker model is developed in view of the specific functionality test requirements of the chip. The checker receives its inputs from the VHDL source file and checks for the occurrence of the required condition/sequence/function. The checker is also written using VHDL.

Figure 4:
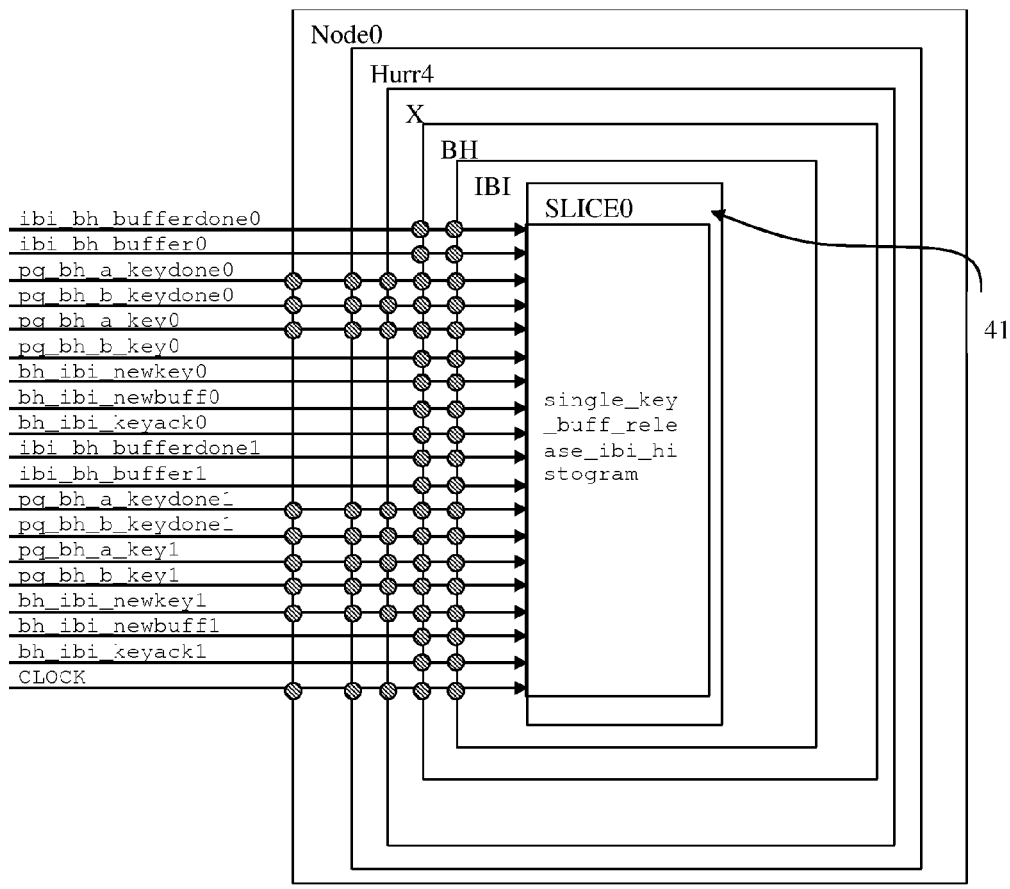
FIG. 4 is a schematic description of the hierarchical structure of the chip model used in the method of FIG. 3.

For validating the checker, the chip functional hierarchy shown in FIG. 4 is emulated with programming modules, some of which are schematically indicated in FIG. 4:
X_slice0.vhexp;
X_ibi_slice0.vhexp;
X_bh_ibi.vhexp;
X_hurr4_x_bh.vhexp; and
node0.vhexp.

Figure 5:
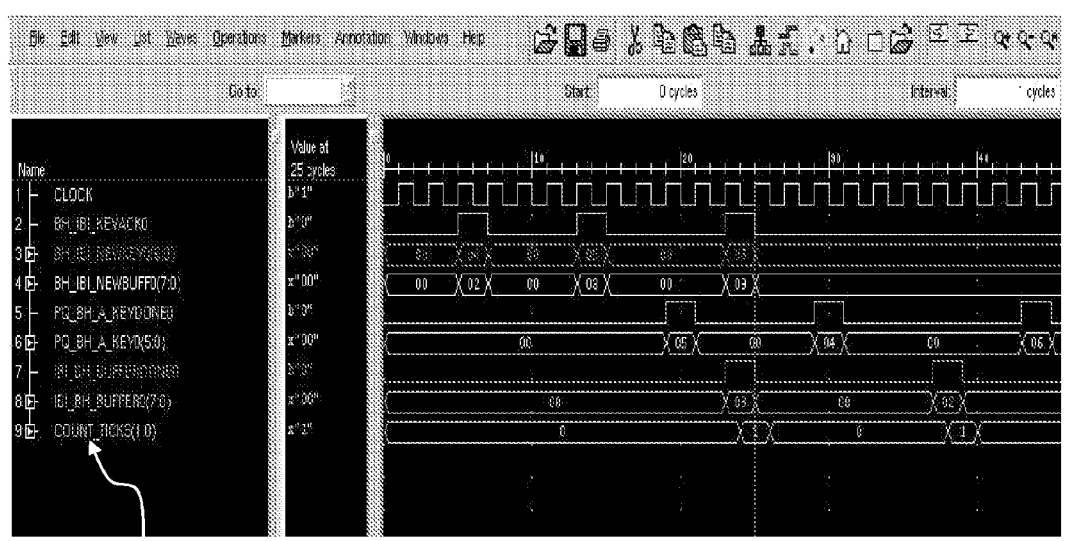
FIG. 5 shows a set of input/output waveforms associated with the method of FIG. 3, the forms indicating a correctly operating checker.

The above modules are compiled in the order of their listing. The last of these modules (node0.vhexp) includes the complete set of signals required to validate the checker. A test case driving the entire verification procedure is also prepared. The chip output signals are emulated according to the actual functionality of the SLICE0 module and are supplied to the checker. If the checker functions properly, it will produce an output for one clock cycle. The actual output of the checker is shown by the "COUNT_TICKS" waveform 51 of FIG. 5. The activation of the signal sequence "COUNT_TICKS" indicates that the checker functions correctly.

Computer Platform

Figure 6:
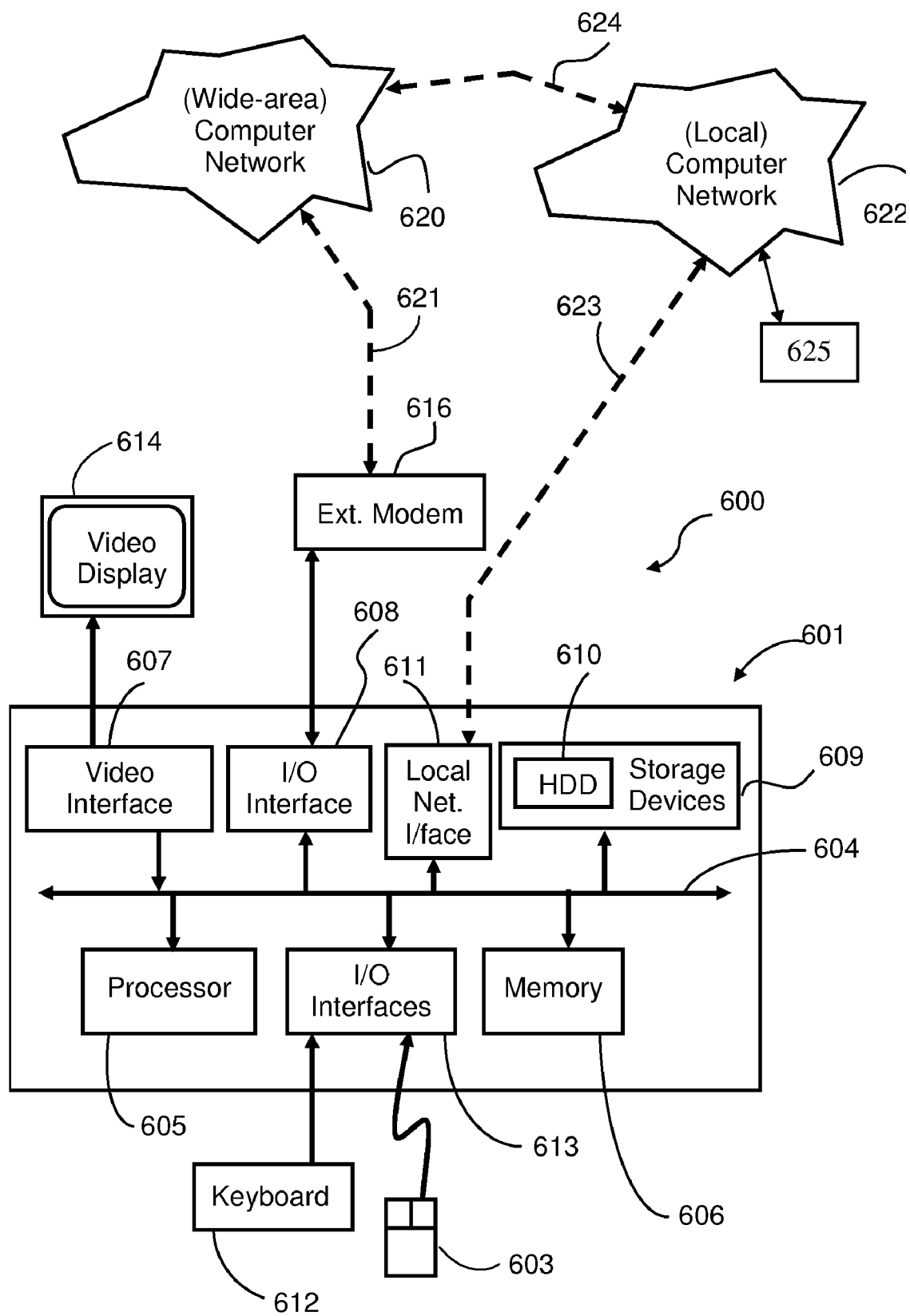
FIG. 6 is a schematic diagram of a computer system for implementing the method of FIG. 3.

FIG. 6 shows a schematic block diagram of a network system 600 with which the method for testing functionality of a chip checker, as described above with respect to FIGS. 2 to 5, can be implemented in the form of application programs executable within a general purpose computer system 601 or within a hand-held device 625. The software implementing any portion of the method may be stored in a computer readable medium including storage devices. In the case illustrated in FIG. 6, the software is loaded into the computer 601 from the computer readable medium 610 and then executed by the computer 601. A computer readable medium having such software or computer program recorded on it is a computer program product.

As seen in FIG. 6, the computer system 601 can include input devices such as a keyboard 602 and a mouse pointer device 603, and output device such as display device 614. In this configuration, the computer 601 can be connected to any other computer systems via a network as data conversion is a means usually utilized when one or more steps of the method needs to be performed by or on multiple computer systems, communicating with each other over a network. An external Modulator-Demodulator (Modem) transceiver device 616 may be coupled to the computer 601 for communicating to and from a communications network 620 via a connection 621. The network 620 may be a wide-area network (WAN), such as the Internet, or a private LAN.

The computer 601 typically includes at least one processor unit 605, and a memory unit 606 for example formed from semiconductor random access memory (RAM) and read only memory (ROM). Here, the processor unit 605 is an example of a processing/computational means which can also be realized with other forms of configuration performing similar functionality. The computer 601 also includes a number of input/output (I/O) interfaces including a video interface 607 that couples to the video display 614, an I/O interface 613 for such devices like the keyboard 602 and mouse 603, and an interface 608 for the external modem 616. In some implementations, the modem 616 may be incorporated within the computer 601, for example within the interface 608. The computer 601 may also have a local network interface 611 which, via a connection 623, permits coupling of the computer system 600 to a local computer network 622, known as a Local Area Network (LAN). As also illustrated, the local network 622 may also couple to the wide network 620 via a connection 624, which would typically include a so-called "firewall" device or similar functionality. The interface 611 may be formed by an Ethernet™ circuit card, a wireless Bluetooth™, an IEEE 802.11 wireless arrangement or a combination of thereof.

Storage devices 609 are provided and typically include a hard disk drive (HDD) 610. It should be apparent to a person skilled in the art that other devices such as a floppy disk drive, an optical disk drive and a magnetic tape drive (not illustrated) may also be used. The components 605 to 613 of the computer 601 typically communicate via an interconnected bus 604 and in a manner which results in a conventional mode of operation of the computer system 600.

Typically, the programming modules that incorporate the method for testing functionality of a chip checker are resident on the storage device 609 and read and controlled in execution by the processor 605. Thus, the processor 605 is responsible for the computational steps such as developing a model of the chip, supplying the developed chip model with the driving signal and supplying the checker with the driving signal and the corresponding response signal generated by the chip. Storage of intermediate product from the execution of such steps may be accomplished using the semiconductor memory 606, possibly in concert with the storage device 609. In some instances, the application programs may be supplied to the user encoded on one or more CD-ROM or other forms of computer readable media and read via the corresponding drive, or alternatively may be read by the user from the networks 620 or 622.

If checker testing is required on the handheld device 625, it can either utilize its own storage and processing means, similar to these described in relation to computer 601, or make use of a wireless network connection to a computer system, such as 601, on which all watermark related processing can be carried out remotely.

The discussed system and a method for testing functionality of a chip checker provide a faster way of compiling of a microchip checker and testing its functionality, thus facilitating the expeditious building of a functionally correct checker. The method provides an overall reduction in the verification and building cycle time, especially where the testing is conducted early in the design cycle.

We claim:

1. A method for testing functionality of a chip checker, the chip checker being arranged for generating a predetermined coverage data output in response to receiving a set of driving signals and a corresponding set of response signals generated by an integrated circuit chip to be tested by said chip checker in response to the set of driving signals, the method comprising;
   a) developing a chip model of the integrated circuit chip to be tested by said chip checker, the chip model emulating at least one response of the integrated circuit chip by generating, upon receiving a predetermined set of driving signals, the corresponding set of response signals;
   b) supplying the developed chip model with the predetermined set of driving signals to generate the corresponding set of response signals;
   c) supplying the chip checker with the set of driving signals synchronously with supplying the chip checker with the corresponding set of response signals generated by the chip model to generate corresponding coverage data output; and
   d) verifying correct operation of the chip checker by comparing the corresponding coverage data output with a predetermined validating pattern.

2. The method for testing functionality of a chip checker of claim 1, wherein the chip model is arranged to emulate modules of a predetermined functional hierarchy.

3. The method for testing functionality of a chip checker of claim 2, the chip checker being arranged for testing the response of the integrated circuit chip to a sequence of driving signals, wherein the response signals of the integrated circuit chip corresponding to the sequence of driving signals originate from at least two hierarchical levels of the integrated circuit chip.

4. A method for facilitating building a chip checker, the chip checker being arranged for generating a predetermined coverage data output in response to receiving a set of driving signals and a corresponding set of response signals generated by the an integrated circuit chip to be tested by said chip checker in response to the set of driving signals, the method comprising;
   a) developing a chip model of the integrated circuit chip to be tested by said chip checker, the chip model emulating at least one response of the integrated circuit chip by generating, upon receiving a predetermined set of driving signals, the corresponding set of response signals;
   b) supplying the developed chip model with the predetermined set of driving signals to generate the corresponding set of response signals;
   c) supplying the chip checker with the set of driving signals synchronously with supplying the chip checker with the corresponding set of response signals generated by the chip model to generate corresponding coverage data output;
   d) verifying correct operation of the chip checker by comparing the corresponding coverage data output with a predetermined validating pattern; and
   e) amending the chip checker, upon detecting incorrect operation of the chip checker.

5. The method for facilitating building a chip checker of claim 4, the method comprising repeating at least the steps c) to e) until the coverage data output generated by the chip checker corresponds to the predetermined validating pattern.

6. The method for facilitating building a chip checker of claim 4, wherein the chip model comprises modules arranged to emulate a predetermined functional hierarchy.

7. The method for facilitating building a chip checker of claim 6, the chip checker being arranged for testing the response of the integrated circuit chip to a sequence of driving signals, wherein the response signals of the integrated circuit chip corresponding to the sequence of driving signals originate from at least two hierarchical levels of the integrated circuit chip.

8. The method of claim 1, the method further comprising executable code arranged to run on a processing unit, the executable code being arranged to, upon execution, effect the steps in the method, the executable code being encoded on a non-transitory computer readable medium.

9. A system for testing functionality of a chip checker, the chip checker being arranged for generating a predetermined coverage data output in response to receiving a set of driving signals and a corresponding set of response signals generated by an integrated circuit chip to be tested by said chip checker in response to the set of driving signals, the system comprising;

a) at least one processor;

b) a chip model of the integrated circuit chip to be tested by said chip checker, the chip model emulating at least one response of the integrated circuit chip by generating, upon receiving a predetermined set of driving signals, the corresponding set of response signals, said chip model being embodied as instructions encoded in a non-transitory computer readable medium and executable by said at least one processor;

c) a checker model of the chip checker, said checker model being embodied as instructions encoded in a non-transitory computer readable medium and executable by said at least one processor; and d) test case module for facilitating the test, wherein the system is arranged so that driving signals are provided to the chip model and the checker model, the checker model being also supplied with, synchronously with the driving signals, the response signals generated by the chip model in response to the driving signals, a failure of the checker model to generate the predetermined coverage data output indicating checker model malfunction.

10. The system for testing functionality of a chip checker of claim 9, wherein the chip model is arranged to emulate modules of a predetermined functional hierarchy.

11. The system for testing functionality of a chip checker of claim 10, wherein the checker model is arranged for testing the response of the integrated circuit chip to a sequence of driving signals and wherein the response signals of the integrated circuit chip corresponding to the sequence of driving signals originate from at least two hierarchical levels of the integrated circuit chip.

\* \* \* \* \*